United States Patent [19]

Badenlou

[11] Patent Number: 5,659,252
[45] Date of Patent: Aug. 19, 1997

[54] APPARATUS AND METHOD FOR DETECTING ARCING IN A CRT

[75] Inventor: Mahmoud Badenlou, San Diego, Calif.

[73] Assignees: Sony Corporation, Tokyo, Japan; Sony Electronics Inc., Park Ridge, N.J.

[21] Appl. No.: 519,511

[22] Filed: Aug. 25, 1995

[51] Int. Cl.⁶ .................................................. G01R 31/02
[52] U.S. Cl. .......................... 324/536; 324/127; 324/529
[58] Field of Search ..................................... 324/536, 522, 324/127, 529; 361/45

[56] References Cited

U.S. PATENT DOCUMENTS

| | | | |
|---|---|---|---|
| 558,517 | 4/1896 | Pieper. | |
| 3,231,808 | 1/1966 | McDaniel. | |
| 3,571,703 | 3/1971 | Russell | 324/59 |
| 3,588,611 | 6/1971 | Lambden | 324/536 |
| 4,088,426 | 5/1978 | Ogura | 318/331 |
| 4,283,678 | 8/1981 | Halter | 324/529 |
| 4,454,557 | 6/1984 | Hurley | 324/127 |
| 4,553,091 | 11/1985 | Bristol | 324/74 |
| 4,734,640 | 3/1988 | Kitahori et al. | 324/127 |
| 4,749,907 | 6/1988 | Boatwright et al. | 315/10 |
| 4,899,103 | 2/1990 | Katzenstein | 324/127 |
| 4,972,153 | 11/1990 | Zucker et al. | 324/522 |
| 5,183,685 | 2/1993 | Tennies et al. | 324/536 |
| 5,189,375 | 2/1993 | Tuttle | 324/127 |
| 5,512,832 | 4/1996 | Russell et al. | 324/522 |

*Primary Examiner*—Kenneth A. Wieder
*Assistant Examiner*—Diep Do
*Attorney, Agent, or Firm*—Limbach & Limbach L.L.P.

[57] ABSTRACT

A method and apparatus for detecting and indicating the number of times a CRT unit arcs. The apparatus is constructed of a ferrite split toroid core wound with wire which is coupled around the focus lead and/or ground lead of a CRT through which a current spike will occur during an arcing event. The wound wire is coupled to a current pulse detector which in turn is coupled to a monostable mode timer and counter for counting the number of arcing events. The counter is coupled to a display device for displaying the number of times the CRT has arced.

14 Claims, 3 Drawing Sheets

APPARATUS AND METHOD FOR DETECTING ARCING IN A CRT

FIELD OF THE INVENTION

The invention pertains to the manufacture, testing and quality assurance of cathode ray tubes (CRTs). More particularly, the invention pertains to a method and apparatus for counting the number of times a CRT arcs.

BACKGROUND OF THE INVENTION

As is well known to those skilled in the related arts, one of the primary components of a cathode ray tube (CRT) display apparatus is the electron gun or guns. In particular, a visual display is created on a phosphorescent screen by a CRT by scanning one or more electron beams across the screen to selectively illuminate picture elements (pixels) on the screen to create a desired display pattern. A monochrome CRT typically comprises a single electron gun. A color CRT typically comprises three electron guns (corresponding to the colors red, green and blue). The combination of the three primary colors in different ratios on any given pixel can create any color in the visible spectrum.

Typically CRTs are manufactured in a clean room environment. Even the slightest contamination by dust or other particles in the neck assembly (which houses the electron gun and the space through which the electron beam or beams travel from the gun to the screen) may significantly affect operation of the CRT. Particularly, if a dust particle or other particle is struck by an electron beam, it typically would cause the CRT to arc, resulting in a current surge in the CRT. The particular lead or leads on which the current surge would occur depends on a number of factors, such as the particular electron beam which struck the particle. The surge, however, would most likely occur on the focus leads and/or ground leads of an electron gun. If the current surge is great enough, it can burn out one or more of the electronic components of the CRT.

Even if an arcing event does not destroy or harm electronic components, it can cause the calibration of the electron gun or guns to be changed. For instance, in a color monitor, the three electron guns are calibrated relative to each other to create the desired color scheme. If these guns are calibrated while a dust particle is in the electron path of one of the guns, they will be calibrated to certain values relative to each other. If a dust particle which existed in the electron path when the initial calibrations were made is later zapped (burned by the electron beam), the initial calibrations may no longer be valid. For instance, if the red electron gun was adjusted to a nominal voltage of 40.2 volts in order to create the desired color scheme, and a dust particle in its electron beam path is later zapped, the 40.2 volts adjustment may no longer be valid and the display may become skewed toward the red end of the color spectrum.

Arcing in the field, leading to operational failure of the CRT or at least to color skew, is one of the more common field failure mechanisms in CRTs.

Most CRT manufactures have quality assurance tests which test the CRT for many possible defects including the existence of particles in the electron beam path which cause or may cause arcing or excessive arcing. It is known that as the number of arcing events increases during manufacturing and/or testing, the more likely the CRT unit is to continue arcing in the field. Excessive arcing during testing indicates that the CRT was either manufactured under less than perfectly clean conditions or that its hardware is itself defective. In either event, it suggests that arcing will continue to occur in the field.

If the arcing was due to dust, as opposed to hardware defects, arcing is likely to continue to occur because it is possible and even likely that other dust particles exist in the neck assembly and that they will move during transportation, thus not causing arcing during testing, but only after the unit is sold and in operation in the field.

Accordingly, it is desirable to determine how often a CRT arcs during the manufacturing and/or quality assurance testing of the unit. Although during manufacturing and testing, a CRT unit may be powered up and operating for several hours (during which time arcing may occur), most of this time is spent outside of the presence of a person who can actually observe the occurrence of arcing. For instance, during manufacturing, a CRT is typically "burned" in an aging tunnel for at least an hour. In the burning process, a CRT unit is powered up and operated in a high temperature environment in order to stabilize its components, particularly the aperture grill. The aperture grill affects the alignment of the beams and typically does not stabilize until at least thirty to forty-five minutes of operation in an aging tunnel. The burning stage is normally conducted outside of the observation of humans.

Accordingly, it is an object of the present invention to provide a method and apparatus for detecting and counting arcing events of a CRT.

It is another object of the present invention to provide a low power, low cost, and digital method and apparatus for detecting arcing in a CRT.

It is a further object of the present invention to provide an improved CRT arc detector.

SUMMARY OF THE INVENTION

The invention comprises a palm size arc detector having one or more probes formed of a split ferrite toroid core wound with ten turn wire. Each probe can be coupled around a lead of a CRT. The lead or leads to which the probe or probes are coupled should be those leads through which a current spike is expected to appear during arcing. Typically, this would include at the least the focus leads and the ground leads of the CRT. The electromagnetic field generated by the current spike in the selected leads will cause a corresponding current spike to run through the ten turn wire of the probe. The wire of each probe is coupled to a current pulse detector which triggers a monostable mode timer every time a current pulse of a predetermined magnitude (e.g., a magnitude high enough to have been caused by an arcing event as opposed to normal operation of the CRT) runs through the probe wire. The magnitude of a current spike caused by an arcing event is substantially higher than the magnitude of the current which runs through the sensed leads during normal operation of the CRT and, therefore, can be easily differentiated therefrom.

The output of the timer is fed to a counter which counts the number of arcing events. The counter is coupled to a display which displays the number of arcing events detected.

If the number of arcing events detected exceeds a predetermined number over a predetermined time period (e.g., if it exceeds two events during the burning stage), the unit is rejected as being likely to continue to arc in the field.

DETAILED DESCRIPTION OF A PREFERRED EMBODIMENT OF THE INVENTION

Figure 1:
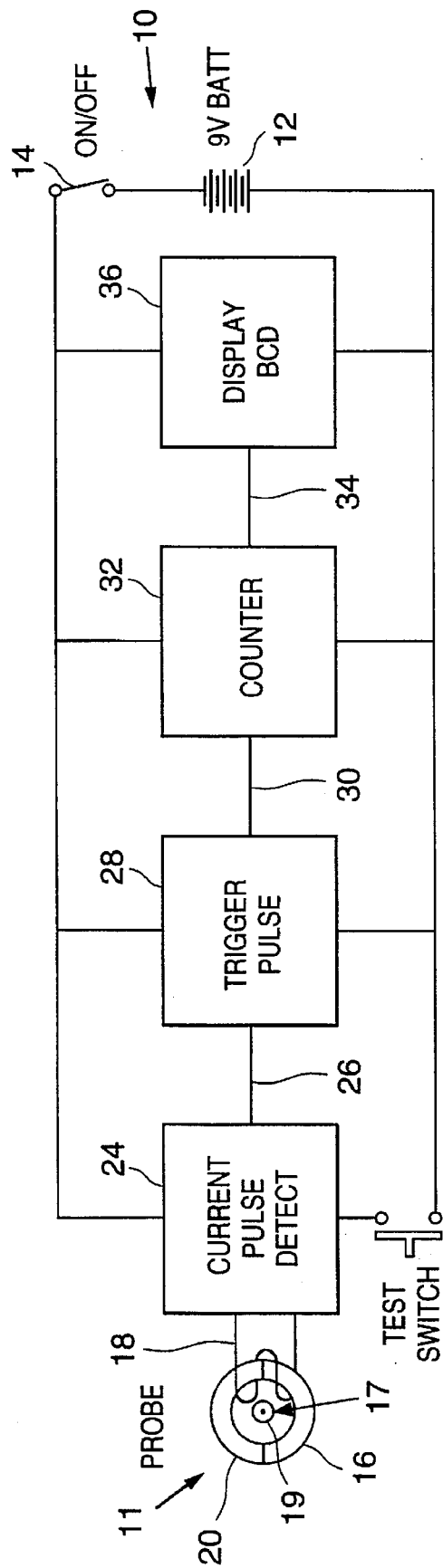
FIG. 1 is a block diagram of the major components of the arc detector of a preferred embodiment of the present invention.

FIG. 1 is a block diagram of an arc counter 10 in accordance with the present invention. A nine volt battery 12 provides the power for operating the unit. An on/off switch 14 also is provided. An inductor 16 is formed by ten turns number 26 enameled wire 18 wound on half of a split toroid core 20. The lead 19 of a CRT on which an arcing event will cause a current spike is placed in the middle 17 of the toroid core 20. The toroid is split and hinged at one end of the split to allow it to be opened so that the lead 19 can be inserted and the toroid 20 closed again.

FIG. 1 shows only one inductor probe 11. However, as many probes can be provided and coupled in parallel to the main circuitry of the arc detector as there are different leads through which an arcing event can be manifested as a current spike. The wire 18 wound around the core is coupled to a current pulse detector 24. Current pulse detector 24 is designed to send a pulse out on line 26 to trigger pulse circuit 28 whenever the current through wire 18 exceeds a specified level. The specified current level is set to a level less than the minimum current spike expected to be caused in wire 18 in response to an arcing event current spike in lead 19, but greater than the maximum current which should be caused to flow through wire 18 when sensing normal CRT operation current levels on lead 19. The current flow in wire 18 should be essentially equal to the current flow in the sensed lead 19 when placed in the middle 17 of the toroid 20. Thus, if current flow through the focus leads and/or ground leads of a CRT during normal operation without arcing is expected to be much less than 1.0 ampere and the current surge during an arcing even is expected to be over 1.3 amperes, the reference current of the counter reasonably may be set to approximately 1.3 amperes.

Trigger pulse circuit 28 sends out a pulse on line 30 to counter 32 each time it receives a current pulse detection signal on line 26.

Counter 32 preferably is a BCD counter which increments its multi-bit BCD output lines 34 each time it receives a pulse on line 30.

The BCD output 34 is forwarded to a display unit 36 which converts the BCD output 34 into a human readable form indicating the number of arcing events which have occurred.

In a preferred embodiment of the invention, the display device 36 comprises a plurality of LEDs which are coupled so as to be driven directly by the BCD output lines. Although it may be more convenient to the user to have a more complex display system in which the BCD output lines are converted into a LED or LCD numeric display, the above described display system is preferred for its low power consumption and circuitry requirements.

After each CRT is tested, the counter 32 and display 36 are reset and the arc counter can be coupled to another CRT in order to perform another test.

Figure 2:
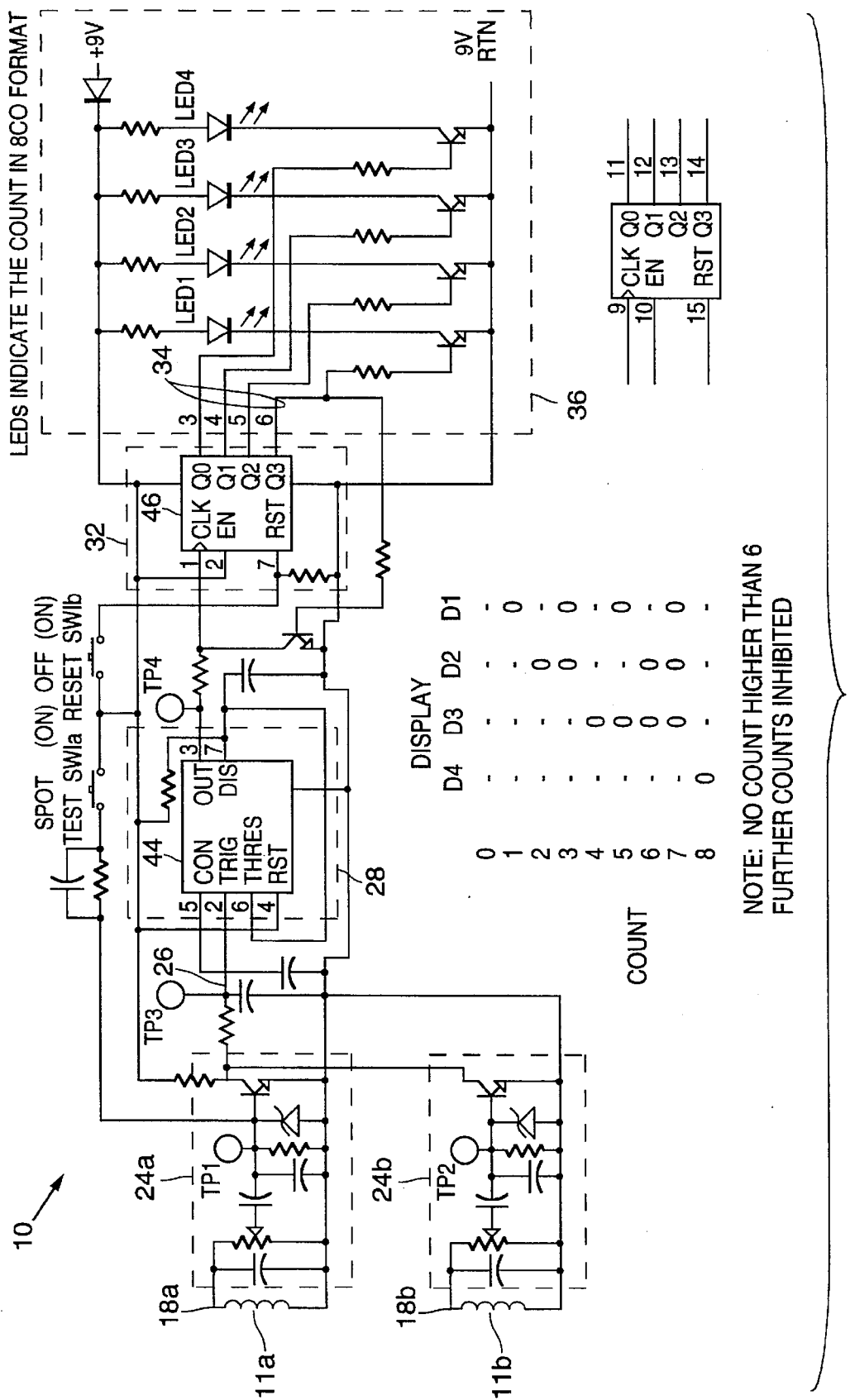
FIG. 2 is a detailed schematic diagram of a preferred embodiment of the present invention.

FIG. 2 is a detailed schematic diagram of an arc counter 10 in accordance with the present invention. As shown, this particular unit comprises two probes 11a and 11b. Accordingly, probe 11a can be coupled to a focus lead of a CRT while probe 11b is coupled to a ground lead of a CRT. Accordingly, arcing events which cause current spikes at either the focus lead or ground lead will be detected. As will become clear, in this particular embodiment of the invention, there is no way to distinguish whether a counted arcing event occurred on the focus lead or the ground lead. Such information typically will not be relevant anyway, since the CRT unit will simply be rejected if the number of arcing events exceeds a predetermined number regardless of which leads those events occurred on.

If it was desirable to distinguish between the leads upon which a current spike occurred, the unit could easily be redesigned to do so, such modifications being obvious to a person of ordinary skill in the related arts. For example, each probe could be coupled to separate detection, counting and display circuitry.

Current through the lead to which probe 11a is coupled will cause current to flow through the wire 18a. That current causes a voltage to appear across resistor R1. As shown, resistor R1 is a variable resistor with on of its terminals coupled to the base of transistor Q1 so that the portion of that voltage drop which appears at the base of transistor Q1 is adjustable. Capacitors C3 and C5 split the voltage drop, preferably in half. Zener diode ZD1 is provided to protect the circuitry of the arc counter 10 from extremely high current surges and, in a preferred embodiment, is a 6.2 volt zener diode. The resistor R1 is adjusted such that the desired predetermined minimum current creates a voltage at the top of resistor R1 just great enough to forward bias transistor Q1.

When a current greater than or equal to the predetermined minimum current flows in wire 18 due to a current surge on the sensed leads of the CRT, it turns on transistor Q1 of current detector 24a. The collector of transistor Q1 is coupled to the trigger terminal of a monostable mode timer 44 of circuit 28. The voltage at the collector of transistor Q1 will go low when transistor Q1 is activated thus triggering low activated monostable mode timer 44. When triggered, timer 44 outputs a 10 millisecond pulse to the CLK input pin of BCD up counter 46 of counter circuit 32. Each time BCD up counter 46 receives a pulse at its clock input terminal, it increments its BCD output terminals Q0 through Q3.

As shown, BCD output lines D0 through D3 of counter 46 are coupled to the base terminals of transistors Q4 through Q7, respectively. The collectors of those transistors are coupled to four LEDs, LED1 through LED4, causing the LEDs to be turned on when the respective BCD output line goes high, and to be turned off when the respective BCD output line goes low. Accordingly, the four LEDs constitute a BCD display on the panel of the arc counter unit 10.

Figure 3:
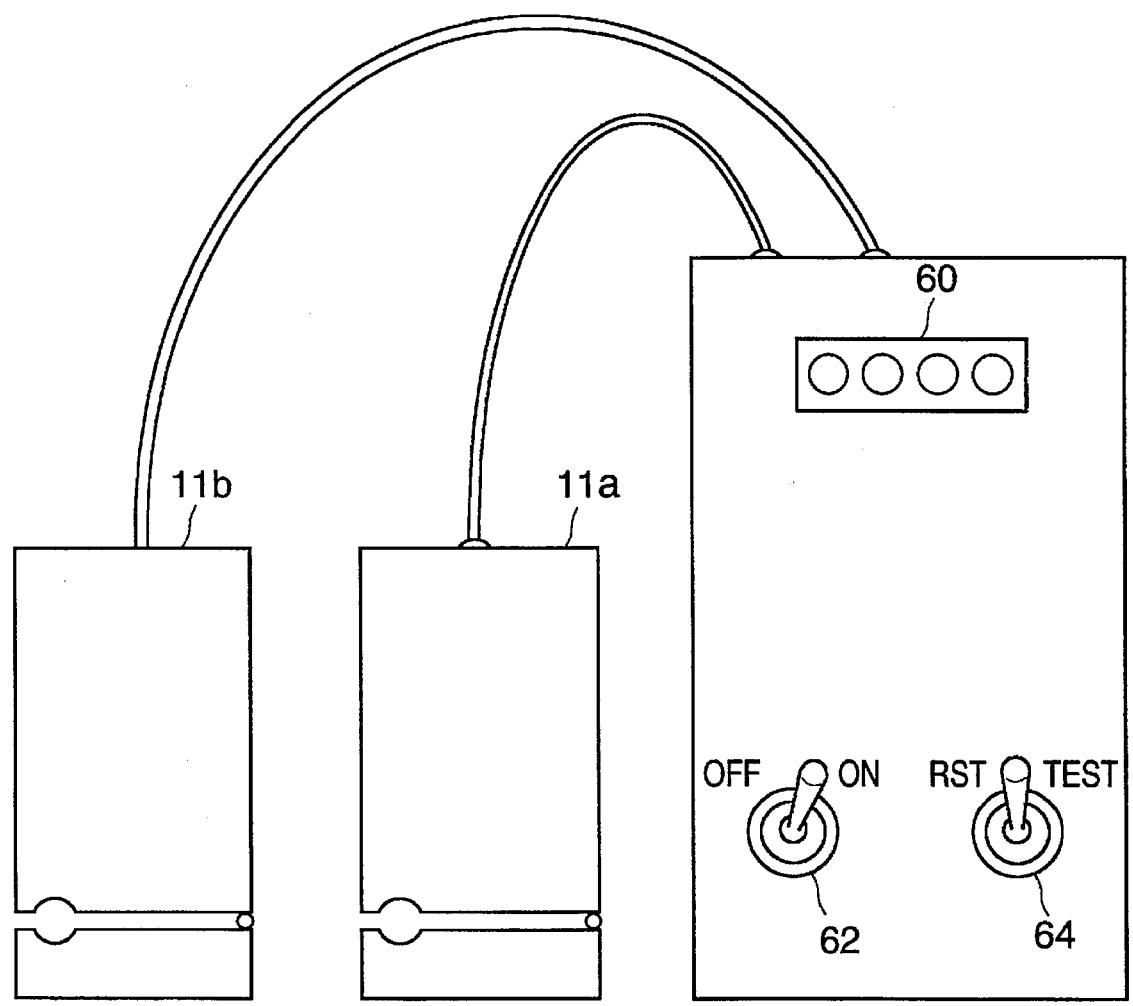
FIG. 3 is a pictorial diagram of an arc counter constructed in accordance with a preferred embodiment of the present invention.

The control panel of the unit 10 is shown in FIG. 3. In addition to the four LED BCD display 60, the unit 10 has only two operator usable switches. The first switch 62 is an on/off switch which can be toggled between on and off, effectively connecting or disconnecting the battery. The second switch 64 is a three position switch which can be toggled between three positions, namely, a reset position, a neutral position, and a test position. The switch 64 is permanently biased to the neutral position. A user can overcome the biasing pressure with hand pressure to place the switch in the reset position or the test position. However, when the hand pressure is released, the switch will return to the neutral position.

When in the neutral position, test switch SW1a and reset switch SW1b shown in FIG. 2 are both open circuited. When in the reset position, reset switch SW1b is closed and test switch SW1a is opened. Finally, in the test position, test switch SW1a and reset switch SW1b is opened.

As can be seen from a review of the circuit in FIG. 2, when the reset switch SW1b is closed, the reset input terminal of counter 46 is activated to reset the counter. When the test switch is closed, the base of transistor Q1 is activated thus causing timer 44 to be triggered.

Accordingly, in operation, a user typically would toggle the second switch to the test position one or more times and observes the display to assure that the display counts upward for each time the second switch is toggled to the test position. If it does not increase each time, then the arc counter is not operating properly. After testing the counter, the user then toggles the second switch to the reset position to reset the counter and display to zero before commencing arc counting on a CRT.

It has been observed that if a CRT which arcs two or more times during the burning stage is substantially more likely to continue arcing than is a CRT which either does not arc or arcs only a single time during the burning stage. Accordingly, if the arc counter displays a count of two or more arcing events during the burning stage, that CRT typically would be rejected.

As noted in FIG. 2, the display unit is limited to a count of eight. The reason for this is simply that, typically, if a CRT arcs eight or more times, it clearly should be rejected regardless of whether the number of arcing events was eight, nine, ten, etc. Accordingly, it not necessary to count any higher than eight.

Probe 11b and current pulse detector 24b shown in FIG. 2 are substantially identically to probe 11a and current pulse detector 24a and are coupled essentially in parallel with probe 11a and current pulse detector 24a to the trigger input terminal of timer 44. If there are more than two leads which should be tested on a given CRT, additional probes and current pulse detectors can be added and coupled in parallel to the trigger input of timer 44.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

I claim:

1. An apparatus for detecting and counting arcing events of a cathode ray tube (CRT) comprising;
    an inductor for electromagnetic coupling to a lead of a CRT,
    a current detector coupled to said inductor for generating a current pulse signal when a current exceeding a specified value flows through said inductor, and
    a counter for counting the number of current pulse signals generated by said current detector, and
    a display for displaying the number of current pulse signals generated by said counter.

2. An apparatus as set forth in claim 1 wherein said inductor comprises a wire wound around a split toroid ferrite core.

3. An apparatus as set forth in claim 1 wherein said counter comprises a binary coded decimal (BCD) counter having a plurality of output lines for representing the count of said counter in BCD and said display comprises a plurality of light emitting diodes coupled to said output lines of said counter.

4. An apparatus as set forth in claim 1 wherein said current detector comprises;
    a transistor coupled to said inductor so as to be turned on when said current exceeds said specified value, and
    a monostable mode timer having an input coupled to said transistor for generating an output signal comprising a pulse each time said transistor is turned on.

5. An apparatus as set forth in claim 4 wherein said counter comprises a BCD counter having an input coupled to said output signal of said timer for counting up each time it receives a pulse from said timer.

6. An apparatus as set forth in claim 4 wherein said inductor comprises a plurality of inductors and said current detector comprises a current detector corresponding to each of said inductors and said current detectors are coupled in parallel to said timer.

7. An apparatus as set forth in claim 4 wherein said transistor comprises a base terminal, a collector terminal and a drain terminal and wherein said base terminal is coupled to said inductor and said collector is coupled to said timer and wherein said transistor is switched on responsive to said current exceeding said specified value so as to cause current to flow through said transistor from said collector terminal to said drain terminal causing a voltage change at said input terminal of said timer.

8. An apparatus as set forth in claim 1 further comprising a reset switch for resetting said counter to zero.

9. An apparatus as set forth in claim 8 further comprising a reset switch coupled to said counter for resetting said counter to zero.

10. An apparatus as set forth in claim 1 further comprising a test switch coupled to said counter for causing said counter to count up each time said switch is closed, whereby proper operation of said counter can be tested.

11. An apparatus as set forth in claim 7 further comprising a test switch coupled to said base terminal of said transistor which switch, when closed, causes a current to flow at said base terminal of said transistor regardless of the condition of said CRT, whereby proper operation of said timer, BCD counter and display can be verified.

12. An apparatus for detecting and counting arcing events of a cathode ray tube (CRT) comprising;
    an inductor for electromagnetic coupling to a lead of a CRT so as to cause a current to flow in said inductor when a current flows in said lead of said CRT,
    a transistor having a base, a collector and a drain, said base coupled to said inductor so as to cause a current to flow at said base of said transistor when said current in said inductor exceeds a specified value such that said transistor is turned on and a current flows from said collector to said drain of said transistor,
    a monostable mode timer having an input coupled to said collector of said transistor, said timer generating an output signal comprising a pulse each time said transistor is turned on,
    a BCD counter having an input coupled to said output signal of said timer and a plurality of output lines, said counter causing said output lines to output a BCD signal indicating the number of counts of said counter, and
    a display comprising a plurality of light emitting diodes, each coupled to one of said output lines of said counter so as to be activated thereby, whereby a BCD visual display of the count of said counter is created.

13. An apparatus as set forth in claim 12 wherein said inductor comprises a wire wound around a split toroid ferrite core.

14. An apparatus as set forth in claim 13 wherein said inductor comprises a plurality of inductors and said transistor comprises a transistor corresponding to each of said inductors and said plurality of transistors are coupled in parallel to said timer.

* * * * *